United States Patent [19]

Ackermann et al.

[11] Patent Number: 4,975,765
[45] Date of Patent: Dec. 4, 1990

[54] HIGHLY INTEGRATED CIRCUIT AND METHOD FOR THE PRODUCTION THEREOF

[75] Inventors: Karl-Peter Ackermann, Niederrohrdorf; Gianni Berner, Baden, both of Switzerland

[73] Assignee: Contraves AG, Zurich, Switzerland

[21] Appl. No.: 376,674

[22] Filed: Jul. 7, 1989

[30] Foreign Application Priority Data

Jul. 22, 1988 [CH] Switzerland .................. 2797/88

[51] Int. Cl.⁵ .................. H01L 23/12; H01L 23/04
[52] U.S. Cl. .................................. 357/80; 357/74
[58] Field of Search .................. 357/70, 74, 80; 174/52.4

[56] References Cited

U.S. PATENT DOCUMENTS

| | | | |
|---|---|---|---|
| 4,102,039 | 7/1978 | Henrickson et al. | 29/593 |
| 4,437,141 | 3/1984 | Prokop | 357/74 |
| 4,566,184 | 1/1986 | Higgins et al. | 29/840 |
| 4,567,643 | 2/1986 | Droguet et al. | 357/80 |
| 4,695,870 | 9/1987 | Patraw | 357/80 |
| 4,701,781 | 10/1987 | Sankhagowit | 357/70 |

FOREIGN PATENT DOCUMENTS

| | | |
|---|---|---|
| 0120500 | 10/1984 | European Pat. Off. |
| 2938567 | 4/1981 | Fed. Rep. of Germany |
| 2094552 | 9/1982 | United Kingdom |
| 8704316 | 7/1987 | World Int. Prop. O. |

OTHER PUBLICATIONS

Patent Abstracts of Japan, vol. 5, No. 159 (E-77) (831), Oct. 14, 1981 & JP, A, 56-88343.
Electronics, Nov. 11 (1985), pp. 26-31, "Japan's Packaging Goes World Class", Charles L. Cohen.
Electronic Packaging & Production, Dec. 1984, pp. 34-39, "Tab Technology Tackles High Density Interconnections".

Primary Examiner—Rolf Hille
Assistant Examiner—S. V. Clark
Attorney, Agent, or Firm—Oblon, Spivak, McClelland, Maier & Neustadt

[57] ABSTRACT

In a highly integrated circuit the semiconductor chip (8) is fastened on a substrate (17) which projects on all sides only a few millimeters beyond the semiconductor chip (8). For Full dynamic testing of the circuit before insertion, connections are provided which are arranged outside the projecting substrate edge (23) with a sufficiently large grid spacing.

In a first embodiment (FIG. 2D) "lost" test connections (5) are used which are separated after testing.

In a second embodiment (FIG. 3E), contact areas in the form of bumps (21) are used for testing which are arranged on the underside of the through-holes (18) lying in the chip mounting area.

In this manner it is possible to realize a circuit with greatly reduced space requirement, which at the same time can be fully tested dynamically before insertion.

13 Claims, 4 Drawing Sheets

HIGHLY INTEGRATED CIRCUIT AND METHOD FOR THE PRODUCTION THEREOF

BACKGROUND OF THE INVENTION

1. Field of the Invention

The present invention relates to the field of microelectronics. In particular, it relates to a highly integrated circuit, especially for a multi-chip module, comprising:

(a) a flat semiconductor chip with a chip area and a plurality of chip connections arranged with a first grid spacing;

(b) a flat substrate with a top side and an underside and a substrate area which is greater than the chip area;

(c) on the top side of the substrate a mounting area, on which the semiconductor chip is arranged;

(d) the substrate projecting on all sides with a substrate edge beyond the semiconductor chip; and (e) there being provided on the top side of the substrate first connecting areas with a grid spacing which is essentially equal to the first grid spacing; and (f) the chip connections being conductively connected to the first connecting areas.

A highly integrated circuit of this type is known from conventional housing technology.

The invention further relates to a method for the production of such a highly integrated circuit, in which, on the top side of the substrate, conductor tracks extend to the edges of the substrate starting from the first connecting areas; and there are provided at the edges of the substrate second connecting areas which are connected to the first connecting areas by means of the conductor tracks.

Finally, the invention relates to a method for the production of such a highly integrated circuit in which there are provided inside the mounting area in the substrate through-metallized through-holes which conductively connect the top side of the substrate to its underside, and have on the underside contact areas in the form of bumps; the through-holes are arranged with a grid spacing which is considerably larger than the first grid spacing; and at least on the top side of the substrate conductor tracks extend to the through-holes starting from the first connecting areas.

2. Discussion of Background

The continued increase in miniaturization and integration in microelectronics is evidenced in the ever more complex highly integrated VLSI (Very Large Scale Integration) circuits.

Further advances into the sub-micrometer range with increased complexity at the same time leads to integrated circuits (IC) with several million transistor functions and with Si-chip areas of more than 12 mm × 12 mm. The number of connections per IC increases overproportionally thereby (Moore's law).

As a result of this development, problems arise above all for the housing technologies for such ICs, that is when the chips are inserted. The housings which are known and used at present, such as, for example, DIP, SO, PLCC, LCCC, PGA etc. (see in this respect: Electronics, Nov. 11 (1985), pp. 26-31) become disproportionately large for connection numbers greater than around 200 per IC and hence uneconomic and unreliable, and lead to increased delay times of the electrical signals to and from the IC.

The reasons for this lie in the requirements for the minimum spacings of the connections of such housings, which must be approximately 0.5 mm to permit solder connections to the carrier substrate (circuit board or ceramic substrate). With 200 connections, housing edge lengths of more than 25 mm thus result, so that the ratio of active chip area to the area requirement of the housing is very poor.

A potential way around this problem is the mounting of naked IC chips (without housing) on a large-area carrier substrate, it being possible to realize the electrical connections from the IC to the substrate by means of flip-chips or wire-bonding, for example.

It is advantageous here to mount several ICs on such a carrier substrate and connect them electrically in a very small space. This results in so-called multi-chip modules (MCM) or multi-chip packages (MCP). A very space-saving and reliable mounting even for ICs with more than 200 connections is achieved thereby.

However, even this housing and mounting technology has its problems: the naked ICs cannot be dynamically tested 100% before mounting, and also cannot undergo a burn-in test. Particularly users of the most up-to-date ICs find themselves often forced to accept a poor yield with these ICs. A poor yield with the ICs has, however, disastrous effects on the yield of the MCM. Thus, for example, where 5 ICs are mounted with a yield of 90% each, the overall yield of the MCM falls to values of less than 60%. It is, however, only possible to replace defective ICs on such MCMs to a limited extent, and in any case is very complex and expensive.

Another potential solution of the housing problem for the ICs is tape automated bonding (TAB). This special housing and mounting technology on a film carrier makes it possible to fully test the ICs before insertion (see in this respect: Electronic Packaging & Production, December, 1984, pp. 34-39).

However, even the TAB technology has a range of serious disadvantages, such as, for example:

the overall area required is still far greater than the active area of the Si-chip;

the ICs must additionally be subjected on the wafer to a special treatment (building of so-called bumps on the IC connections in a wafer fabrication);

special, expensive tools are required for mounting; and the testing and the handling must be carried on special machines.

TAB is therefore only suitable for selected applications where, for example, high numbers or a very small design height are required.

SUMMARY OF THE INVENTION

Accordingly, one object of this invention is to provide a novel highly integrated circuit which can be fully tested dynamically before mounting, the space requirement of which is only insignificantly greater in comparison to the active chip area, and which can be produced and mounted without special tools and machines, as well as to disclose methods for the production thereof.

The object is achieved for a highly integrated circuit of the type mentioned at the beginning in that the substrate edge has an edge width of only a few millimeters and connections for testing the semiconductor chip are provided outside of the substrate edge.

An edge width of less than 2 mm is preferably selected.

Since such an edge width is not sufficient to accommodate test connections with a sufficiently large grid spacing, according to the invention the latter are arranged outside the substrate edge.

A first preferred exemplary embodiment of the invention is defined in that (a) on the top side of the substrate conductor tracks extend to the edges of the substrate starting from the first connecting areas; and (b) there are provided at the edges of the substrate second connecting areas which are connected to the first connecting areas by the conductor tracks.

In this arrangement test connections are not provided at all on the finished circuit, but are only present in an intermediate stage of production.

The method according to the invention for the production of such a circuit is defined by the following steps:

(a) applied to a substrate plate, which has an area considerably greater than the substrate area, and which contains the later substrate with the mounting area lying in the center of the area, are, inside the substrate area, the first connecting areas, and outside the substrate area, test connections with a considerably larger grid spacing, as well as conductor tracks connecting the first connecting areas to the test connections;

(b) the semiconductor chip is fastened on the substrate plate inside the mounting area;

(c) the chip connections are conductively connected to the first connecting areas;

(d) the functioning of the semiconductor chip is fully tested by means of the test connections; and (e) the substrate is separated from the substrate plate, the conductor tracks being severed at the edges of the substrate.

A second preferred exemplary embodiment of the invention is defined in that (a) there are provided inside the mounting area in the substrate through-metallized through-holes which conductively connect the top side of the substrate to its underside, and have on the underside contact areas in the form of bumps;

(b) the through-holes are arranged with a grid spacing which is considerably larger than the first grid spacing; and (c) at least on the top side of the substrate conductor tracks extend to the through-holes starting from the first connecting areas.

With this exemplary embodiment, the bumps on the underside of the through-holes serve with their comparatively large grid spacing both for testing and connecting the circuit.

The method according to the invention for the production of such a circuit is defined by the following steps:

(a) the through-holes are made in the substrate inside the mounting area;

(b) applied to the substrate are the first connecting areas, as well as conductor tracks which connect the first connecting areas to the through-holes;

(c) the through-holes are through-metallized and provided on the underside with the bumps;

(d) the semiconductor chip is fastened on the substrate inside the mounting area;

(e) the chip connections are conductively connected to the first connecting areas; and (f) the functioning of the semiconductor chip is fully tested by means of the bumps.

Further exemplary embodiments can be found in the subclaims.

The present invention thus solves the above-mentioned problems by means of a novel housing and mounting concept which can even be used on complex ICs with a large number of connections. This concept is especially suitable also for the mounting of a plurality of such ICs on a circuit board, that is for multi-chip modules.

The present invention is marked by the following advantages:

the IC can be fully tested dynamically before mounting (including burn-in test);

the space requirement is only insignificantly greater than for the Si-chip itself; and no special tools and machines (except a wire-bonder) and no special fabrication steps during the IC production are necessary.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
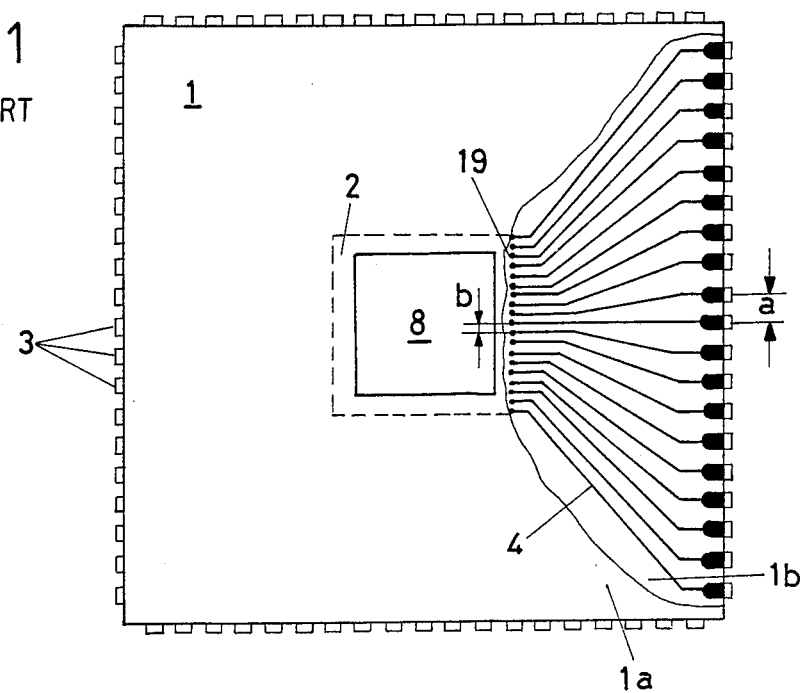
FIG. 1 shows a known housing configuration for a highly complex IC.

Referring now to the drawings, wherein like reference numerals designate identical or corresponding parts throughout the several views, FIG. 1 shows a housing configuration for a highly complex IC according to the prior art. It comprises a housing 1, which consists essentially of a top ceramic plate 1a and a bottom ceramic plate 1b (the top ceramic plate 1a is partially omitted in the drawing so that the connections can be seen).

Provided on the bottom ceramic plate 1b in the center of the plate area is a mounting area 2 for a semiconductor chip 8 (the active IC). At the edge of the housing 1, peripheral connection contacts 3 are arranged with a standardized grid spacing a, which is 1.27 mm (corresponding to 1/20" or 50 mil), for example. This comparatively large grid spacing a is necessary to ensure proper soldering of the connection contacts when the configured IC is inserted.

On the bottom ceramic plate 1b conductor tracks 4 lead from the connection contacts 3 to the mounting area 2 and open out there into small first connection areas 19 which are arranged with a grid spacing b along the periphery of the mounting area 2. The grid spacing b is very much smaller than the grid spacing a and approximately corresponds to the grid spacing of the chip connections (22 in FIG. 2B) on the semiconductor chip 8, which have not been drawn in FIG. 1 for the sake of clarity. Chip connections and first connecting areas 19 are (likewise not shown) usually conductively interconnected by means of wire-bonding.

The entire circuit can be fully tested dynamically via the connection contacts 3 before insertion. However, this advantage is achieved at the cost of the space requirement for the housing 1 being far greater than the area determined by the semiconductor chip 8.

Figure 2A:
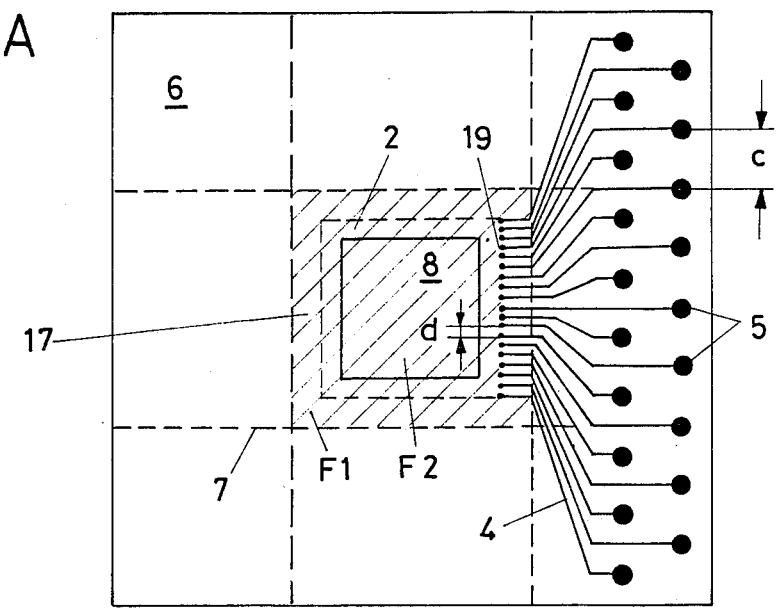
FIGS. 2A-G show various steps during the production and mounting of a highly integrated circuit according to a first preferred exemplary embodiment of the invention.

In order to realize both full dynamic testability and a drastically reduced space requirement at the same time, the invention takes the following approach in accordance with a preferred exemplary embodiment illustrated in FIGS. 2A-G:

To begin with, a relatively large-area substrate plate 6 is used (FIG. 2A). This substrate plate 6 consists, for example, of a conventional insulating ceramic (Al2O3 or the like), of silicon coated with an insulating area layer, or of a glass, and has, if 224 connections for the IC are assumed, for example, an area of 1"×1", for example.

Contained in the substrate plate 6 is a substrate 17 (shown hatched in FIG. 2A) with a substrate area F1 which is substantially smaller than the area of the substrate plate 6, and which is only slightly greater (approximately 1-2 mm on all sides) than the semiconductor chip 8 with a chip area F2. The substrate area F1 is defined inside the substrate plate 6 by separation lines 7, along which the substrate 17 is separated from the substrate plate 6 at a later time (after testing).

Applied to the substrate plate 6 are conductor tracks 4 which open out on the one side into the first connecting areas 19 and on the other side into test connections 5. The first connecting areas 19 lie in this arrangement inside the substrate area F1 along the periphery of the mounting area 2; the test connections 5 lie outside this substrate area at the edge of the substrate plate 6.

While the first connecting areas 19 also have a grid spacing d here which corresponds approximately to the grid spacing of the chip connections, the test connections 5 can be designed with a grid spacing c of 1.27 mm, for example, so that the circuit can be fully tested in this state in a conventional testing device.

The first connecting areas 19, conductor tracks 4 and test connections 5 are preferably applied by chemical deposition of a plurality of metal layers, especially of Cu, Ni and Au, to the substrate plate 6 (shown only for one plate side in FIG. 2A for the sake of clarity).

Figure 2B:
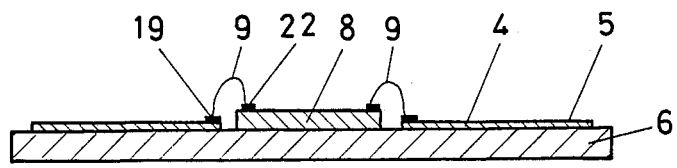
Figure 2C:
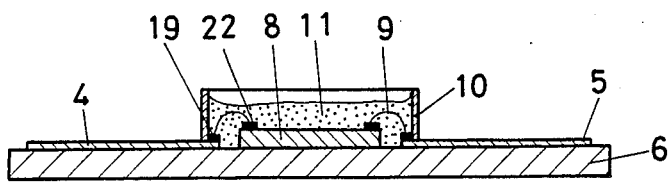
Figure 2D:
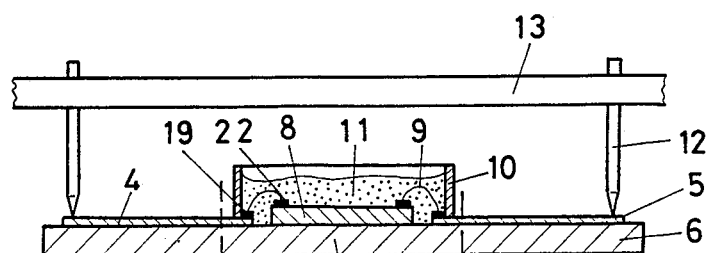

After the substrate plate 6 has been provided with the wiring pattern in this manner, the semiconductor chip 8 is fastened inside the mounting area 2 on the substrate plate 6, and the chip connections 22 are conductively connected to the first connecting areas 19 (FIG. 2B).

In the sectional representation of FIG. 2B, the technique of wire-bonding is used for the connection, in which connecting wires 9 which are bonded to the first connecting areas 19 and the chip connections 22 are used.

Figures 4, 5:
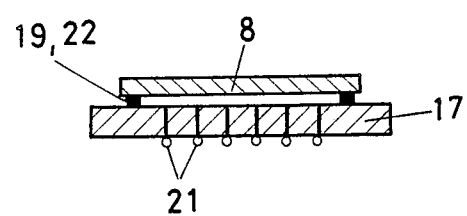
FIG. 4 shows an alternative type of connection (flip-chip) to that shown in FIG. 2B.
FIG. 5 shows an alternative type of connection (flip-chip) to that shown in FIG. 3D.

An alternative connection technique to this, which is known by the name of "flip-chip", is represented in FIG. 4. In this arrangement, the first connecting areas 19 are arranged in mirror-image fashion to the chip connections 22 inside the mounting area 2, and the semiconductor chip 8 is conversely directly soldered to the first connecting areas 19.

After the mechanical and electrical mounting of the semiconductor chip 8 on the substrate plate 6 has been completed, the semiconductor chip 8 is covered for protection with a sealing compound 11 (for example an epoxy or silicone compound) (FIG. 2C), specifically in such a manner that the conductor tracks 4 at the edges of the later substrate 17 lie free for connecting purposes. A corresponding limiting of the sealing compound 11 is achieved in the example of FIG. 2C by a correspondingly large frame 10, which serves as a type of casting form.

Casting serves here to protect the semiconductor chip 8 and especially the connecting wires 9. In the case of the alternative flip-chip connection technique according to FIG. 4, use of the sealing compound 11 is not necessary.

The circuit protected in this manner is then fully tested dynamically (FIG. 2D) in a conventional testing device, which has test needles 12 with a corresponding grid spacing mounted in a test holder 13, and if necessary subjected to a burn-in test.

Once the dynamic test (and the burn-in test) has been completed successfully, the substrate 17 with the cast semiconductor chip 8 and the conductor tracks 4 lying free at the edges of the substrate 17 are separated along the separation lines 7 from the substrate plate 6. Inasmuch as the substrate plate 6 is made of a ceramic or of a glass, this separation operation can be carried out by scoring and subsequent breaking. A sawing or cutting operation is, however, equally conceivable. The conductor tracks 4 are severed thereby at the edges of the substrate 17.

Figure 2E:
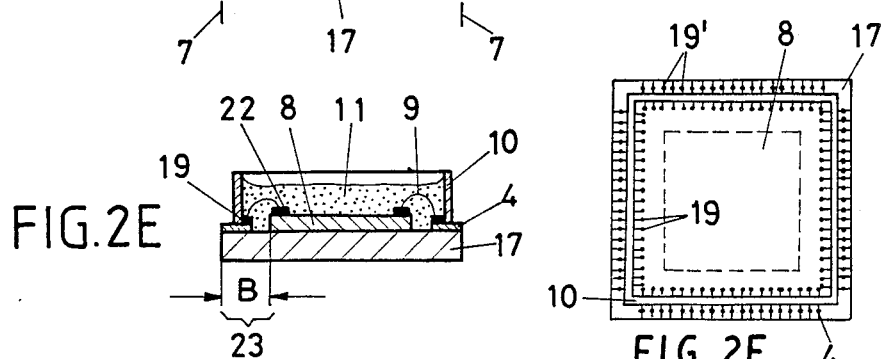
Figure 2F:
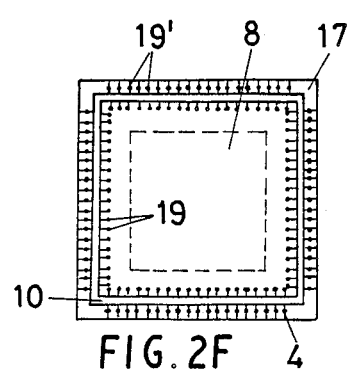
Figure 2G:
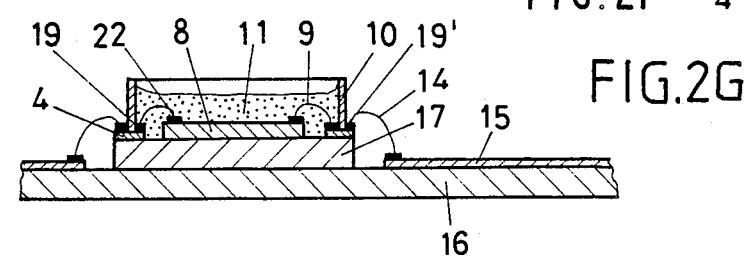

The result is a highly integrated circuit, as is shown in section in FIG. 2E and in plan view in FIG. 2F. It is marked by the fact that the substrate 17 projects on all sides with a substrate edge 23 beyond the semiconductor chip 8, which has an edge width B of only a few millimeters, and that there are no longer connections provided for testing the circuit on the substrate edge.

The finished and fully tested circuit can then be inserted into a multi-chip module, for example, the circuit, fastened on a larger circuit board 16 by means of wire-bonding, being electrically connected (FIG. 2G) by means of connecting wires 14 to conductor tracks 15 on the circuit board 16. In this arrangement, on the IC side the connection is made to second connecting areas 19', which are arranged at the ends of the conductor tracks 4 lying free to a length of only a few 100 μm.

A solution according to the principle of "lost" test connections which is equally valid to the one described above will now be explained with reference to the exemplary embodiment illustrated in FIGS. 3A-F.

In this arrangement, the same connections are used for testing that also served to connect the IC to a larger circuit board. In this case, too, these connections lie outside the substrate edge, specifically inside the mounting area directly under the semiconductor chip.

Figure 3A:
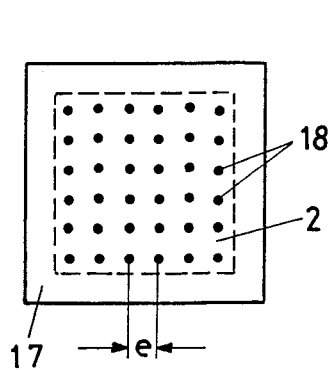
FIGS. 3A-F show various steps during the production and mounting of a highly integrated circuit according to a second preferred exemplary embodiment of the invention.

We start here not with a larger substrate plate, but directly with the substrate 17 in its final size. A plurality of through-holes 18 are made in the substrate 17, which can be made of the same material as the substrate plate 6, inside the mounting area 2 with a grid spacing e, which is considerably larger than the grid spacing of the chip connections and is preferably 1.27 mm (FIG. 3A). The through-holes 18, which extend from the top side of the substrate 17 to its underside, later serve for the conductive connection of top side and underside. They can be produced, for example, in a ceramic substrate by means of a laser.

Figure 3B:
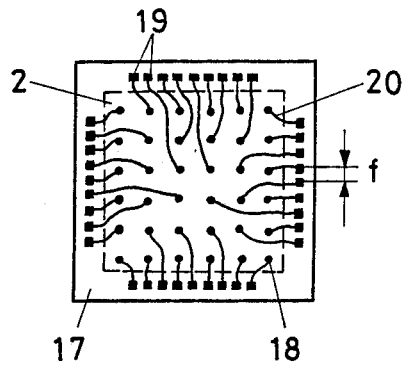
Figure 3C:
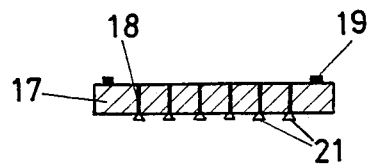
Figure 3D:
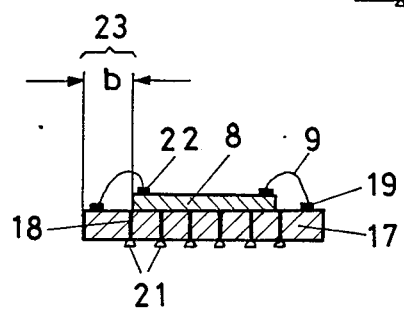

Applied to the bored substrate 17 (for example with the methods already described) are the first connecting areas 19 and conductor tracks 20, which connect the first connecting areas 19 to the through-holes 18 (FIG. 3B). The conductor tracks 20 can here be arranged both on the top side and on the underside of the substrate 17. The first connecting areas 19 have a grid spacing f, which is likewise approximately equal to the grid spacing of the chip connections.

Additionally, or at the same time as the conductor and connection structures are applied, the through-holes 18 are through-metallized and provided on the underside of the substrate 17 (preferably by electro-chemical deposition) with contact areas in the form of so-called bumps 21. This results in a substrate as shown in section in FIG. 3C. In this representation, the conductor tracks 20 are not drawn in for the sake of simplicity.

The semiconductor chip 8 is then fastened on the substrate 17 prepared in this manner and electrically connected to the substrate 17. This is done again either by wire-bonding (FIG. 3D: connecting wires 9 from the chip connections 22 to the first connecting areas 19) or by flip-chip mounting (FIG. 5).

At this point it should be mentioned that when flip-chip mounting (FIGS. 4,5) is used, the following steps are to a large extent analogous to the steps shown for the wire-bonding methods, with the difference that casting can be dispensed with here.

The mechanically and electrically mounted semiconductor chip 8 is subsequently cast with the sealing compound 11 (FIG. 3E), whereby in this case the substrate edge 23 can also be fully coated because the electrical connection of the IC takes place via the bumps 21 on the underside of the substrate 17.

Figure 3E:
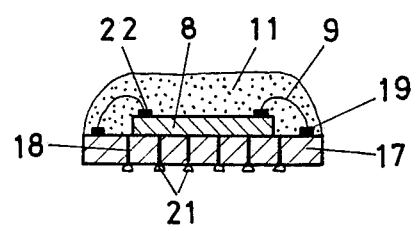
Figure 3F:
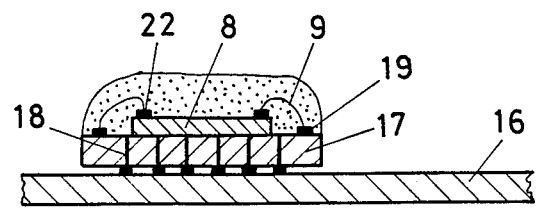

In the cast state according to FIG. 3E, the IC is fully tested dynamically (the testing needles of the tester contacting the bumps 21 from the underside of the substrate 17) and can finally be fastened by means of flip-chip mounting on the circuit board 16 (FIG. 3F; the conductor tracks present on the circuit board 16 are not shown in the figure).

As both exemplary embodiments show, the invention makes highly integrated circuits available which on the one hand permit full dynamic testing and burn-in testing before final mounting, and on the other hand do not take up significantly more space than the active Si-chip.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A highly integrated circuit, especially for a multi-chip module, comprising:
   a flat semiconductor chip with a chip area and a plurality of chip connections arranged with a first grid spacing;
   a flat substrate with a top side and an underside and a substrate area which is greater than the chip area;
   on the top side of the substrate a mounting area, on which the semiconductor chip is arranged;
   the substrate projecting on all sides with a substrate edge beyond the semiconductor chip; and
   there being provided on the top side of the substrate first connecting areas with a second grid spacing which is essentially equal to the first grid spacing; and
   the chip connections being conductively connected to the first connecting areas; wherein the circuit is surrounded by an additional substrate edge provided for testing the semiconductor chip, where said additional substrate edge carries conductor tracks and test connections, extends beyond the chip area, and is separable after testing; and the circuit extends to a substrate area which is greater than the chip area, so that the substrate edge is of a width of only a few millimeters.

2. A highly integrated circuit, especially for a multi-chip module, comprising:
   a flat semiconductor chip with a chip area and a plurality of chip connections arranged with a first grid spacing;
   a flat substrate with a top side and an underside and a substrate area which is greater than the chip area;
   on the top side of the substrate a mounting area, on which the semiconductor chip is arranged;
   the substrate projecting on all sides with a substrate edge beyond the semiconductor chip; and
   there being provided on the top side of the substrate first connecting areas with a second grid spacing which is essentially equal to the first grid spacing; and
   the chip connections being conductively connected to the first connecting areas; wherein
   the substrate edge has an edge width less than 2 millimeters; and
   connections for testing the semiconductor chip are provided outside of the substrate edge.

3. A highly integrated circuit as claimed in claim 2, wherein
   on the top side of the substrate conductor tracks extend to the edges of the substrate starting from the first connecting areas; and
   there are provided at the edges of the substrate second connecting areas which are connected to the first connecting areas by the conductor tracks.

4. A highly integrated circuit as claimed in claim 2, wherein
   there are provided inside the mounting area in the substrate through-metallized through-holes which conductively connect the top side of the substrate to its underside, and have on the underside contact areas in the form of bumps;
   the through-holes are arranged with a third grid spacing which is considerably larger than the first grid spacing; and
   at least on the top side of the substrate conductor tracks extend to the through-holes starting from the first connecting areas.

5. A highly integrated circuit as claimed in either of claims 3 and 4, wherein the first connecting areas are connected to the chip connections by means of connecting wires and the semiconductor chip is covered by a sealing compound.

6. A highly integrated circuit as claimed in either of claims 3 or 4, wherein the first connecting areas are arranged in mirror-image fashion to the chip connections and are soldered directly thereto.

7. A highly integrated circuit as claimed in claim 1, wherein the edge width is less than 2 mm.

8. A highly integrated circuit as claimed in claim 1, wherein
on the top side of the substrate conductor tracks extend to the edges of the substrate starting from the first connecting areas; and
there are provided at the edges of the substrate second connecting areas which are connected to the first connecting areas by the conductor tracks.

9. A highly integrated circuit as claimed in claim 1, wherein
there are provided inside the mounting area in the substrate through-metallized through-holes which conductively connect the top side of the substrate to its underside, and have on the underside contact areas in the form of bumps;
the through-holes are arranged with a third grid spacing which is considerably larger than the first grid spacing; and
at least on the top side of the substrate conductor tracks extend to the through-holes starting from the first connecting areas.

10. A highly integrated circuit as claimed in claim 8, wherein the first connecting areas are connected to the chip connections by means of connecting wires and the semiconductor chip is covered by a sealing compound.

11. A highly integrated circuit as claimed in claim 9, wherein the first connecting areas are connected to the chip connections by means of connecting wires and the semiconductor chip is covered by a sealing compound.

12. A highly integrated circuit as claimed in claim 9, wherein the first connecting areas are arranged in mirror-image fashion to the chip connections are soldered directly thereto.

13. A highly integrated circuit as claimed in claim 9, wherein the first connecting areas are arranged in mirror-image fashion to the chip connections and are soldered directly thereto.

* * * * *